US011686048B2

(12) United States Patent
Hendriks et al.

(10) Patent No.: US 11,686,048 B2
(45) Date of Patent: Jun. 27, 2023

(54) ARAMID-BASED PAPER WITH IMPROVED PROPERTIES

(71) Applicant: TEIJIN ARAMID B.V., Arnhem (NL)

(72) Inventors: Antonius J. J. Hendriks, Arnhem (NL); Yen Vu, Arnhem (NL); Ernst Michael Winkler, Arnhem (NL); Jan-Cees Tiecken, Didam (NL)

(73) Assignee: TEIJIN ARAMID B.V., Arnhem (NL)

( * ) Notice: Subject to any disclaimer, the term of this patent is extended or adjusted under 35 U.S.C. 154(b) by 254 days.

(21) Appl. No.: 17/059,021

(22) PCT Filed: May 27, 2019

(86) PCT No.: PCT/EP2019/063636
§ 371 (c)(1),
(2) Date: Nov. 25, 2020

(87) PCT Pub. No.: WO2019/228972
PCT Pub. Date: Dec. 5, 2019

(65) Prior Publication Data
US 2021/0140108 A1 May 13, 2021

(30) Foreign Application Priority Data
May 28, 2018 (EP) .................................. 18174520

(51) Int. Cl.
| | |
|---|---|
| *D21H 13/26* | (2006.01) |
| *D04H 1/4342* | (2012.01) |
| *D04H 1/587* | (2012.01) |
| *D21H 17/55* | (2006.01) |
| *D21H 27/08* | (2006.01) |

(52) U.S. Cl.
CPC .......... *D21H 13/26* (2013.01); *D04H 1/4342* (2013.01); *D04H 1/587* (2013.01); *D21H 17/55* (2013.01); *D21H 27/08* (2013.01)

(58) Field of Classification Search
CPC ........ D21H 13/26; D21H 17/55; D21H 27/08; D21H 17/40; D04H 1/4342; D04H 1/587; D04H 1/732; H01B 3/52; H05K 1/0366
See application file for complete search history.

(56) References Cited

U.S. PATENT DOCUMENTS

| | | | | |
|---|---|---|---|---|
| 2,999,788 | A | | 9/1961 | Morgan |
| 3,756,908 | A | * | 9/1973 | Gross ..................... D21H 13/26 162/146 |
| 4,698,267 | A | * | 10/1987 | Tokarsky ............... D21H 13/26 428/476.3 |
| 4,729,921 | A | * | 3/1988 | Tokarsky ............... D21H 13/26 428/326 |
| 5,026,456 | A | * | 6/1991 | Hesler .................... D21H 13/26 162/146 |
| 5,789,059 | A | * | 8/1998 | Nomoto .............. B29D 99/0089 428/116 |
| 6,120,643 | A | | 9/2000 | Levit |
| 7,015,159 | B2 | | 3/2006 | Auza et al. |
| 8,268,434 | B2 | * | 9/2012 | Levit ....................... B32B 29/02 52/302.1 |
| 9,903,073 | B2 | * | 2/2018 | Fujimori ................ D21H 17/72 |
| 10,407,829 | B2 | * | 9/2019 | Lee .......................... D21H 27/30 |
| 2005/0230072 | A1 | * | 10/2005 | Levit ...................... H05K 1/0366 162/146 |
| 2009/0214818 | A1 | | 8/2009 | Levit et al. |
| 2009/0282596 | A1 | | 11/2009 | Carbajal et al. |
| 2015/0211182 | A1 | | 7/2015 | Hagiopol et al. |
| 2016/0197325 | A1 | | 7/2016 | Alvarado Chacon et al. |
| 2021/0140108 | A1 | * | 5/2021 | Hendriks .............. D04H 1/4342 |
| 2022/0290375 | A1 | * | 9/2022 | Kang ...................... D21H 27/00 |

FOREIGN PATENT DOCUMENTS

| | | | | |
|---|---|---|---|---|
| EP | 1756360 | B1 | * 8/2012 | ............. D21H 13/26 |
| JP | 2021525318 | A | * 9/2021 | ............. D21H 13/26 |
| WO | 2004/099476 | A1 | 11/2004 | |
| WO | 2005/059211 | A1 | 6/2005 | |
| WO | 2005/059247 | A1 | 6/2005 | |
| WO | 2005/103376 | A1 | 11/2005 | |
| WO | 2012/093047 | A1 | 7/2012 | |
| WO | 2014/079761 | A1 | 5/2014 | |
| WO | 2014/087232 | A1 | 6/2014 | |
| WO | 2015/032678 | A1 | 3/2015 | |

OTHER PUBLICATIONS

Jul. 19, 2019 Search Report issued in International Patent Application No. PCT/EP2019/063636.
Jul. 19, 2019 Written Opinion of the International Searching Authority issued in International Patent Application No. PCT/EP2019/063636.

\* cited by examiner

*Primary Examiner* — Jose A Fortuna
(74) *Attorney, Agent, or Firm* — Oliff PLC

(57) ABSTRACT

An aramid-based paper comprising at least 90 wt. % of aramid material, the aramid material including at least one of aramid shortcut and aramid fibril, the paper including at most 40 wt. % aramid pulp, calculated on the total amount of aramid material, wherein the paper includes 0.1-10 wt. % of polyamido-amine epichlorohydrin (PAE). It has been found that the incorporation of 0.1-10 wt. % of polyamido-amine epichlorohydrin (PAE) into an aramid-based paper including at least 90 wt. % of aramid material calculated on the weight of the paper not including the PAE, the aramid material including at least one of aramid shortcut and aramid fibril, the paper including at most 40 wt. % aramid pulp, leads to a surprising improvement of the z-strength and the tear strength of the paper.

20 Claims, No Drawings

ARAMID-BASED PAPER WITH IMPROVED PROPERTIES

BACKGROUND

The present invention is directed to aramid-based papers with improved properties.

Aramid papers are known for their attractive properties. The use of the high-tensile strength aramid material makes it possible to obtain papers with a high tensile strength and further attractive properties. Accordingly, aramid papers find use in many applications.

For example, WO2014079761 describes a paper for use in electrical insulation applications, in particular in insulated conductors, which comprises comprising 40-80 wt. % of aramid fibrid, 10-50 wt. % of aramid pulp, and 10-50 wt. % of aramid short-cut.

WO2015032678 describes a paper suitable for use as separator in an electrochemical cell, which comprises at least 60 wt. % of aramid fibril and at least 1 wt. % of aramid fiber, the paper having a grammage of 5 to 100 g/m2, and the aramid fibril having a Canadian Standard Freeness (CSF) in the wet phase of less than 300 ml and a specific surface area (SSA) after drying of less than 3 m2/g.

WO2012093047 describes a paper with a grammage of 10-100 g/m2 comprising at least 20 wt. % of aramid microfilaments and at least 20 wt. % of a non-resinous binder, the microfilaments having an average filament length in the range of 2-25 mm and titer less than 1.3 dtex, the non-resinous binder comprising at least one of aramid fibrid or pulp. The paper is claimed for use in a separator, e.g., in fuel cells, batteries or capacitors, for printed wiring boards, for honeycombs, for packaging, for electrical insulation, or in filter applications.

While aramid papers are attractive for many applications, it has been found that there is need to improve their properties.

In paper processing, winding and unwinding are important steps which occur not only in the paper making process but also in the calendaring and slitting paper process and during manufacture of the final product. During high-speed winding and unwinding steps, there is a risk of the paper tearing, especially for relatively thin papers. This not only leads to destruction of the paper; it also disrupts the paper processing, which has to be stopped and restarted. Therefore, an increased tear strength will result in improved paper processing. In some applications and processing steps, the strength of the paper in the z-direction, that is, perpendicular to the paper surface is important. For example, when aramid papers are converted to three-dimensional products such as cores for sandwich structures, e.g., honeycombs, folded cores, corrugated cores (also known as corrugated boards), and others, the paper is put under strain also in the z-direction. If the z-strength of the paper is insufficient, it may delaminate. Accordingly, especially for applications where aramid papers are converted to three-dimensional products, e.g., as cores for sandwich structures, such as honeycombs, folded cores or corrugated cores, it is desired to provide a paper with improved z-strength.

SUMMARY

The present invention provides an aramid-based paper with improved z-strength and tear strength. The present invention pertains to an aramid-based paper comprising at least 90 wt. % of aramid material, the aramid material comprising at least one of aramid shortcut and aramid fibrid, the paper comprising at most 40 wt. % aramid pulp, calculated on the total amount of aramid material, wherein the paper comprises 0.1-10 wt. % of polyamido-amine epichlorohydrin (PAE).

DETAILED DESCRIPTION

It has been found that the incorporation of 0.1-10 wt. % of polyamido-amine epichlorohydrin (PAE) into an aramid-based paper comprising at least 90 wt. % of aramid material calculated on the weight of the paper not including the PAE, the aramid material comprising at least one of aramid shortcut and aramid fibrid, the paper comprising at most 40 wt. % aramid pulp, leads to a surprising improvement of the z-strength and the tear strength of the paper. Further advantages of the present invention and specific embodiments thereof will become clear from the further specification.

It is noted that, as the skilled person will be aware, there is no direct relationship between the z-strength, the tear strength, and the tensile strength of a paper. This will be elucidated below. First, the direction of forces applied to measure these parameters are different from each other. For tensile strength the measuring force is applied parallel to the x or y-direction of the paper (depending on whether the tensile strength is measured on the paper in the machine direction or in the cross-machine direction). In contrast, for the z-strength the measuring force is applied perpendicularly to the paper plane (z-direction). For the tear strength the measuring force is applied at a specific angle to the paper plane in either the x or the y-direction. Second, as in a paper the fibers are primarily oriented in the paper plane and not in the z-direction, the fiber orientation in the paper influences the z-strength, tear strength and tensile strength of paper in different ways.

It is noted that PAE has been described in the art to improve the wet tensile index of cellulose-based papers. Reference is made, e.g., to WO20140872323 and US20150211182. The chemical properties of cellulose and aramid are very different. Cellulose is a reactive hydrophilic material with a substantial number of hydroxyl groups and carboxylic acid groups on the surface. In contrast, aramid is a relatively inert hydrophobic material without hydroxyl groups and with only a very limited amount of carboxylic acid groups. Therefore, the use of a compound in cellulose papers has no predictive value for the use of an additive in aramid-based papers. Further, as indicated above, there is no direct relationship between tensile strength of a paper and its z-strength and tear strength.

It is also noted that WO2005/103376 describes an aramid blend paper comprising 50-95 wt. % para-aramid pulp and 5-50 wt. % of floc with an initial modulus of less than 3000 cN/dtex. The crux of the invention described in this document is that selecting a floc with an initial modulus lower than 3000 cN/dtex makes it possible to make a paper which can stably be produced on a Fourdrinier type paper making machine and which can have a stiffness comparable to that of m-aramid paper. It is indicated that the paper may optionally comprise less than 20 wt. % of a polymer binder material to achieve a higher strength. The definition of the polymer material is broad, ranging from water-soluble or dispersible polymers added directly to the paper making dispersion or thermoplastic binder fibers of the resin material intermingled with the aramid fibers to be activated as a binder by heat applied during drying or following additional compression and/or heat treatment. It is indicated that the preferred materials for the water-soluble or dispersible binder polymer are water-soluble or water-dispersible thermosetting resins such as polyamide resins, epoxy resins, phenolic resins, polyureas, polyurethanes, melamine formaldehyde resins, polyesters and alkyd resins, generally, with a preference for water-soluble polyamide resins typical for the papermaking industry. It is indicated that water solutions and dispersion of non-cured polymers can be used as well (poly(vinyl alcohol), poly(vinyl acetate), etc.). Thermoplastic binder floc can be made from such polymers as poly (vinyl alcohol), polypropylene, polyester and the like. This reference thus discloses, among numerous other possibilities, the use of water-soluble polyamide resins as binder, but the disclosure is in the context of a paper comprising at least 50 wt. % para-aramid pulp. Further, as indicated above, there is no direct relationship between tensile strength of a paper and its z-strength and tear strength.

The invention will be discussed in more detail below.

The paper of the present invention is an aramid-based paper. Within the context of the present specification, an aramid-based paper is a paper which contains at least 90 wt. % of aramid material, calculated on dry paper components not including the PAE. It may be preferred for the paper to contain at least 95 wt. % of aramid material, in particular at least 98 wt. % of aramid material. Aramid material refers to pulp, shortcut (also indicated as floc), fibrid, and fibrils.

In the context of the present specification aramid refers to an aromatic polyamide which is a condensation polymer of aromatic diamine and aromatic dicarboxylic acid halide. Aramids may exist in the meta- and para-form, both of which may be used in the present invention. The use of aramid wherein at least 85% of the bonds between the aromatic moieties are para-aramid bonds is considered preferred. As typical members of this group are mentioned poly(paraphenylene terephthalamide), poly(4,4'-benzanilide terephthalamide), poly(paraphenylene-4,4'-biphenylenedicarboxylic acid amide) and poly (paraphenylene-2,6-naphthalenedicarboxylic acid amide or copoly(para-phenylene/3,4'-dioxydiphenylene terephthalamide). The use of aramid wherein at least 90%, more in particular at least 95%, of the bonds between the aromatic moieties are para-aramid bonds is considered preferred. The use of poly(paraphenylene terephthalamide), also indicated as PPTA is particularly preferred. This applies to all aramid components present in the paper according to the invention, unless specified otherwise.

The paper according to the invention comprises 0.1-10 wt. % of polyamido-amine epichlorohydrin (PAE). Polyamidoamine epichlorohydrin (PAE) polymers are known in the art and require no further elucidation. They are generally obtained by polymerizing a dicarboxylic acid with a polyalkylene polyamine to form a polyamidoamine backbone comprising secondary amine groups. The secondary amine groups are reacted with epichlorohydrin, to form tertiary amines and quaternary ammonium salts, resulting in the formation of azetidinium rings. The azetidinium ring is regarded as the active component of PAE because it can open and form crosslinks. PAE resins are commercially available from, int. al., Solenis under the trade name Kymene. The PAE resin generally has an average molecular weight of at least 10.000 g/mole, e.g., in the range of 50.000 to 2.000.000 g/mole.

The amount of PAE resin in the paper generally is between 0.1 and 10 wt. %, calculated on dry weight of the paper.

If the amount of PAE resin is below 0.1 wt. %, the advantageous effect on tear strength and z-strength will not be obtained. It may be preferred for the amount of PAE to be at least 0.5 wt. %, in some embodiments at least 1 wt. %.

If the amount of PAE resin is above 10 wt. %, no additional improvement on tear strength and z-strength is obtained, while other properties of the paper may be detrimentally affected. It may be preferred for the amount of PAE resin present in the paper to be at most 8 wt. %, in particular at most 5 wt. %, in some embodiments at most 4.5 wt. %, at most 4.0 wt. %, or at most 3 wt. %. An amount of at most 2 wt. % may also be preferred.

As will be discussed below, the PAE resin can be added to the paper during the paper-making process or after the paper has been manufactured. The PAE resin will generally be applied in an aqueous medium. To arrive at the desired amount of PAE in the final paper, it will be necessary to take into account that not all PAE added to the system may end up in the paper. Therefore, the amount of PAE added to the paper during manufacture may be 100 to 400% of the amount of PAE in the final paper, depending on the degree of retention.

The aramid-based paper of the present invention comprises an aramid material the aramid material comprising at least one of aramid shortcut and aramid fibrid. In the context of the present specification, and as is conventional in the field, aramid refers to an aromatic polyamide which is a condensation polymer of aromatic diamine and aromatic dicarboxylic acid halide. Aramids may exist in the meta- and para-form, both of which may be used in the present invention.

It may be preferred for the aramid in the paper according to the invention to consist for at least 10 wt. % of para-aramid, to ensure adequate dimensional stability. This can be effected, e.g., by using meta-aramid shortcut in combination with para-aramid fibrid, para-aramid shortcut in combination with meta-aramid fibrid, a mixture of meta- and para-aramid shortcut in combination with meta-aramid fibrid or para-aramid fibrid, or in any other combination. In one embodiment, the aramid in the paper according to the invention consists for at least 20 wt. % of para-aramid, in some embodiments at least 40 wt. %, in some embodiments at least 60 wt. %, or at least 80 wt. %.

Aramid shortcut, also known as aramid floc, is known in the art. It is generally obtained by cutting aramid fibers to the desired length, in general a length in the range of 0.5-25 mm. In a preferred embodiment the average length is at least 2 mm, in particular at least 3 mm. In some embodiments it may be at least 4 mm. The average length of the microfilaments preferably is at most 15 mm, in one embodiment at most 10 mm.

The shortcut generally has a titer in the range of 0.05-5 dtex. Shortcut with titers below 0.05 dtex have been found difficult to process. Shortcut with a titer above 5 dtex may result in paper with less attractive properties. It may be preferred for the shortcut to have a titer of at least at least 0.3 dtex, in particular at least 0.4 dtex, in some embodiments at least 0.5 dtex and/or at most 3 dtex in particular at most 2 dtex.

The shortcut may be para-aramid shortcut, meta-aramid shortcut, or a mixture of meta and para-aramid shortcut. The use of para-aramid shortcut is considered preferred.

It is preferred for the paper according to the invention to comprise at least 5 wt. % of aramid shortcut, in particular para-aramid shortcut, in particular at least 10 wt. %, calculated on the dry weight of the paper not including the PAE.

Within the context of the present specification the term aramid fibrid refers to small, non-granular, non-rigid film-like particles. The film-like fibrid particles have two of their three dimensions in the order of microns, and have one dimension less than 1 micron. In one embodiment, the fibrids used in the present invention have an average length in the range of 0.2-2 mm, and average width in the range of 10-500 microns, and an average thickness in the range of 0.001-1 microns.

In one embodiment, the aramid fibrid comprises less than 40%, preferably less than 30%, of fines, wherein fines are defined as particles having a length weighted length (LL) of less than 250 micron.

Meta-aramid fibrids may, e.g., be obtained by shear precipitation of polymer solutions into coagulating liquids as is well known from U.S. Pat. No. 2,999,788. Fibrids of wholly aromatic polyamides (aramids) are also known from U.S. Pat. No. 3,756,908, which discloses a process for preparing poly(meta-phenylene isophthalamide) (MPD-I) fibrids. Para-aramid fibrids can, e.g., be obtained by high shear processes such as for example described in WO2005/059247, which fibrids are also called jet-spun fibrids.

If aramid fibrids are used in the present invention, they may be para-aramid fibrids, meta-aramid fibrids, or a combination thereof. It is preferred for the aramid fibrid to be para-aramid fibrid. The most suitable papers have been made from para-aramid fibrid with a Schopper-Riegler (SR) value between 50 and 90, preferably between 75 and 85. These fibrids preferably have a specific surface area (SSA) of less than 10 m2/g, more preferably between 0.5 and 10 m2/g, most preferably between 1 and 4 m2/g.

In one embodiment, fibrids are used with a LL0.25 of at least 0.3 mm, in particular of at least 0.5 mm, more in particular at least 0.7 mm. In one embodiment the LL0.25 is at most 2 mm, more in particular at most 1.5 mm, still more in particular at most 1.2 mm. LL0.25 stands for the length weighted length of the fibrid particles wherein particles with a length below 0.25 mm are not taken into account.

If so desired, the paper of the present invention comprises aramid fibril, in particular para-aramid fibril. Aramid fibril can, e.g., be obtained by direct spinning from solution, e.g. as described in WO2004/099476. In one embodiment the aramid fibril has a structural irregularity expressed as the difference in CSF (Canadian Standard Freeness) of never dried fibril and dried fibril of at least 100, preferably of at least 150. In one embodiment fibrils are used having in the wet phase a Canadian Standard Freeness (CSF) value less than 300 ml, preferably less than 150 ml, and after drying a specific surface area (SSA) less than 7 m2/g, preferably less than 1.5 m2/g, and preferably a weight weighted length for particles having a length>250 micron (WL 0.25) of less than 1.2 mm, more preferably less than 1.0 mm. Suitable fibrils and their preparation method are described, e.g., in WO2005/059211.

The paper of the present invention comprises at most 40 wt. % aramid pulp, in particular para-aramid pulp, calculated on the total amount of aramid material. This limitation on the pulp content ensures that the paper contains adequate amounts of shortcut and/or fibrid and/or fibril as defined above. It may be preferred for the paper of the present invention to contain at most 35 wt. % of aramid pulp. In some embodiments the amount of pulp may be limited further, e.g., to be at most 30 wt. %, or at most 20 wt. %, or at most 10 wt. %. Papers which do not contain aramid pulp are also envisaged within the present invention.

In the present specification, the wording "aramid pulp" refers to aramid material comprising stems with a diameter of the order of 5-50 micron and a length of 0.5-6 mm with fibrils extending from the stem. The fibrils are fine, fiberlike extensions with a diameter which generally is in the sub-micron range. Aramid pulp is known in the art. It may be derived from aramid fibres which are cut to a length of, e.g.,
0.5-6 mm, and then subjected to a fibrillation step, wherein the fibers are pulled apart to form the fibrils, whether or not attached to a thicker stem. Pulp of this type may be characterized by a length of, e.g., 0.5-6 mm, and a Schopper-Riegler of 15-85. In some embodiments, the pulp may have a surface area of 4-20 m2/g.

In one embodiment, the paper according to the invention has a grammage in the range of 5 to 1000 g/m2, more in particular in the range of 10 to 300 g/m2.

In one embodiment, the paper has a relatively low grammage, as for low grammage papers an improvement in the tear strength may be particularly relevant. Accordingly, in one embodiment the paper has a grammage of 5-100 g/m2, in particular 5-60 g/m2, in particular 5-40 g/m2. This may be of particular relevancy for papers to be used as separator in batteries.

In another embodiment, where the paper is to be used in the manufacture of three-dimensional products for core applications, e.g., honeycombs, folded cores, corrugated cores, and others, it may be preferred for the papers to have a grammage in the range of 10-120 gm/m2, in particular 20-100 g/m2.

In one embodiment, the paper according to the invention has a thickness in the range of 10 micron to 1 mm, in particular 15 to 500 micron more in particular in the range of 30 to 300 micron.

The paper according to the invention may have a density in the range of 0.2-1.2 g/cm3.

In one embodiment of the present invention, the aramid paper comprises 10-60 wt. % of aramid fibrid, in particular 20-40 wt. % of aramid fibrid, in particular para-aramid fibrid, in combination with 40-90 wt. % of aramid shortcut, in particular 60-80 wt. % of aramid shortcut, in particular para-aramid shortcut, and less than 30 wt. % aramid pulp, in particular less than 20 wt. % aramid pulp, more in particular less than 10 wt. % of aramid pulp.

In one embodiment of the present invention, the aramid paper comprises 10-60 wt. % of aramid fibrid, in particular 20-40 wt. % of aramid fibrid, in particular para-aramid fibrid, in combination with 30-90 wt. % of meta-aramid shortcut, in particular 60-80 wt. % of meta-aramid shortcut, and less than 30 wt. % aramid pulp, in particular less than 20 wt. % aramid pulp, more in particular less than 10 wt. % of aramid pulp.

In another embodiment of the present invention, the aramid paper comprises 30-70 wt. % of aramid fibrid, in particular 40-60 wt. % of aramid fibrid, in particular para-aramid fibrid, in combination with 20-60 wt. % of aramid shortcut, in particular 20-40 wt. % of aramid shortcut, in particular para-aramid shortcut. If so desired, the paper may contain up to 40 wt. % aramid pulp, in particular up to 30 wt. % aramid pulp, e.g., 10-25 wt. % aramid pulp.

In another embodiment of the present invention, the aramid paper comprises 10-60 wt. % of aramid fibrid, in particular 20-50 wt. % of aramid fibrid, in particular para-aramid fibrid, in combination with 10-50 wt. % of aramid shortcut, in particular 15-40 wt. % of aramid shortcut, in particular para-aramid shortcut. If so desired, the paper may contain up to 40 wt. % aramid pulp, e.g., 10-40 wt. % aramid pulp.

The paper of in the present invention can be manufactured by methods known in the art. In one embodiment, a suspension, generally an aqueous suspension, is prepared comprising the various aramid materials as described above, and any further paper components. The suspension is applied onto a porous screen, so as to lay down a web of randomly interwoven material onto the screen. Water is removed from the web, e.g., by pressing and/or applying vacuum, followed by drying to make paper. If so desired, the dried paper is subjected to a calendering step. Calendering steps are known in the art. They generally involve passing the paper through a set of rolls, optionally at elevated temperatures. The PAE can be added to the suspension or to a suspension of one or more starting materials. It is also possible to contact the final paper with a PAE solution. It is preferred to include the PAE at a relatively early stage in the paper making process, so as to ensure sufficient interaction of the PAE with the aramid. It will be clear to the skilled person how this can be effected.

Papers of the present invention can be used in all applications where the use of aramid-based papers has been found attractive. Examples include electrical insulation, separators for batteries or supercapacitors, three-dimensional products such as honeycombs, folded cores, and corrugated cores, use in filtration, use in electronics applications such as printed wiring boards and backings for solar cells, etc.

It has been found that due to their improved z-strength, the papers of this invention are particularly suitable for use in three-dimensional structures such as cores for sandwich structures, e.g., honeycombs, folded cores, corrugated cores, and others. Sandwich structures are known in the art. They comprise a low density structure, e.g., a paper-based structure such as a honeycomb core, folded core, or corrugated core, sandwiched between two surface sheets, also indicated as facings, face sheets, or skins.

Therefore, in one embodiment, the invention pertains to a three-dimensional core for a sandwich structure, comprising the paper described herein.

In one embodiment, the invention pertains to a honeycomb core comprising a plurality of interconnected walls having surfaces that define a plurality of honeycomb cells, wherein the cell walls are formed from the paper as described herein. Honeycomb cores are known in the art and require no further elucidation here.

In another embodiment, the invention pertains to a corrugated core structure comprising a corrugated sheet of the paper described herein. Corrugated cores are known in the art and require no further elucidation here.

In a further embodiment, the invention pertains to a folded core structure comprising a plurality of folded tessellated configurations, said folded tessellated configurations comprising a paper as described herein. These folded core structures are known in the art and require no further elucidation here.

As is explained above, it has been found that the use of PAE resin improves the z-strength of aramid-based paper. Therefore, in one embodiment, the invention pertains to the use of 0.1-10 wt. % of polyamido-amine epichlorohydrin (PAE) to improve the z-strength of an aramid-based paper as described herein.

It will be clear to the skilled person that various preferred embodiments described herein can be combined, unless they are mutually exclusive.

The invention is illustrated by the following examples, without being limited thereto or thereby.

Example 1

Improvement of Z-Strength and Tear Strength of Para-Aramid Handsheets

To show the effect of the present invention, comparative papers were manufactured on a Rapid Koethe (RK) handsheet former according to the method of ISO 5269-2. A paper according to the invention was prepared by adding PAE resin (Kymene 625, ex-Solenis) to the suspension before providing it to the handsheet former. The PAE resin was added in an amount of 4.1 wt. %, calculated on the dry weight of the paper.

A comparative paper was prepared by a process wherein no PAE was added. Drying was done using the RK-dryer under vacuum at 95° C.

The papers contained 70 wt. % of para-aramid shortcut with a linear density of 1.1 dtex and length of 6 mm (Twaron® T2000, 6 mm, ex Teijin Aramid, NL) and 30 wt. % never-dried para-aramid fibrids (Twaron® D8016, ex Teijin Aramid, NL). The papers had a grammage of 30 g/m2.

Z-strength was measured in accordance with Tappi T541. Tear strength was measured by Elmendorf Tear measurement method in accordance with Tappi 414. Grammage was determined in accordance with ASTM D646.

The results are presented in table 1 below.

TABLE 1

| | Z-strength (Fmax) (kPa) | Tear resistance (mN) | Tear index (mNm2/g) |
|---|---|---|---|
| Paper according to the invention (4.1 wt. % PAE added) | 165 | 723 | 24 |
| Comparative paper (no PAE) | 77 | 423 | 14 |

As can be seen from the results in Table 1, the addition of 4.1 wt. % PAE resulted in a substantially improved Z-strength, tear resistance, and tear index.

Example 2

The Effect of the Amount of PAE

To show the influence of the amount of PAE, papers with different amounts of PAE were manufactured as follows:

Never-dried para-aramid fibrids (Twaron® D8016, ex Teijin Aramid, NL) were dispersed in a pulper at a 1.5% consistency for 15 minutes. PAE-resin (Kymene GHP20, ex-Solenis), was dosed to the fibrid dispersion in the amounts mentioned in Table 2, and the system was mixed with a regular agitator for 5 minutes. The fibrid dispersion containing the PAE-resin was added into a tank and further diluted. After a few minutes of continued agitation, para-aramid shortcut with a linear density of 1.7 dtex and a length of 6 mm (Twaron® T1000, 6 mm, ex Teijin Aramid, NL) was added resulting in a final consistency of 0.1%. The solid materials were 30 wt. % p-aramid fibrids and 70 wt. % p-aramid short-cut.

The resulting dispersion was fed to an inclined wire machine to make paper with a grammage of 30 g/m2.

Table 2 below provides the amount of PAE dosed to the papers (dry solids based) and the z-strength and tear index.

TABLE 2

| | Added PAE (wt. %)* | Z-strength (Fmax) (kPa) | Tear index (mNm2/g) |
|---|---|---|---|
| Comparative | 0 | 85 | 14 |
| Invention 1 | 1.5 | 196 | 20 |
| Invention 2 | 2.5 | 261 | 25 |
| Invention 3 | 4.0 | 250 | 24 |

*added amount of PAE, based on dry weight paper

As can be seen from Table 2, increasing amounts of PAE result in increased z-strength and tear index.

Example 3

Improvement of Z-Strength and Tear Strength of Handsheets Comprising Meta-Aramid and Para-Aramid To show the effect of the present invention in blended para- and meta-aramid papers, comparative papers were manufactured on a Rapid Koethe (RK) handsheet former according to the method of ISO 5269-2.

The papers contained 70 wt. % of meta-aramid shortcut with a linear density of 1.7 dtex and length of 6 mm (TeijinConex®, 6 mm, ex Teijin Aramid, TL) and 30 wt. % never-dried para-aramid fibrids (Twaron® D8016, ex Teijin Aramid, NL). The papers had a grammage of 40 g/m2.

A paper according to the invention was prepared by adding PAE resin (Kymene GHP20, ex-Solenis) to the suspension before providing it to the handsheet former. The PAE resin was added in an amount of 2 wt. %, calculated on the dry weight of the paper. A comparative paper was prepared by a process wherein no PAE was added. Drying was done using the RK-dryer under vacuum at 95° C.

Z-strength was measured in accordance with Tappi T541. Tear strength was measured by Elmendorf Tear measurement method in accordance with Tappi 414. Grammage was determined in accordance with ASTM D646.

The results are presented in table 3 below.

TABLE 3

|  | Z-strength (Fmax) (kPa) | Tear resistance (mN) | Tear index (mNm2/g) |
|---|---|---|---|
| Paper according to the invention (2 wt. % PAE added) | 127 | 1099 | 27 |
| Comparative paper (no PAE) | 87 | 680 | 16 |

As can be seen from the results in Table 3, the addition of 2 wt. % PAE resulted in a substantially improved Z-strength, tear resistance, and tear index.

The invention claimed is:

1. Aramid-based paper comprising
   0.1-4.5 wt. % of polyamido-amine epichlorohydrin (PAE), calculated based on dry weight of the paper, and
   at least 90 wt. % of aramid material, calculated on dry paper components not including the PAE, the aramid material comprising at least one of aramid shortcut, aramid fibrid and aramid fibril, and
   the paper comprising at most 40 wt. % aramid pulp, calculated on the total amount of aramid material.

2. The paper according to claim 1, which comprises at least 95 wt. % of the aramid material.

3. The paper according to claim 1, wherein the amount of PAE is at least 0.5 wt. % and at most 4.0 wt. %.

4. The paper according to claim 1, wherein the paper comprises at least 5 wt. % of the aramid shortcut calculated on the dry weight of the paper not including the PAE.

5. The paper according to claim 4, wherein the paper includes at least 10 wt. % aramid shortcut calculated on the dry weight of the paper not including the PAE, and the aramid shortcut is para-aramid shortcut.

6. The paper according to claim 1, comprising at most 35 wt. % of the aramid pulp.

7. The paper according to claim 1, which has a grammage of 5 to 1000 g/m².

8. The paper according to claim 7, which has a grammage of 5-100 g/m².

9. The paper according to claim 7, which has a grammage in the range of 10-120 g/m².

10. The paper according to claim 1, comprising 10-60 wt. % of the aramid fibrid, in combination with 40-90 wt. % of the aramid shortcut, and less than 30 wt. % of the aramid pulp.

11. The paper according to claim 10, wherein the aramid fibrid is 20-40 wt. % of para-aramid fibrid, in combination with 60-80 wt. % of para-aramid shortcut.

12. The paper according to claim 1, comprising 30-70 wt. % of the aramid fibrid, in combination with 20-60 wt. % of the aramid shortcut, and optionally up to 40 wt. % of the aramid pulp.

13. The paper according to claim 12, wherein the aramid fibrid is para-aramid fibrid, in combination with 20-40 wt. % of para-aramid shortcut.

14. The paper according to claim 1, comprising 10-60 wt. % of the aramid fibril, in combination with 10-50 wt. % of the aramid shortcut, and optionally up to 40 wt. % of the aramid pulp.

15. The paper according to claim 14, wherein the aramid fibril is 20-50 wt. % of para-aramid fibril, in combination with 10-50 wt. % of para-aramid shortcut.

16. The paper according to claim 1, comprising 10-60 wt. % of the aramid fibrid, in combination with 30-90 wt. % of the aramid shortcut which is meta-aramid shortcut, and less than 30 wt. % of the aramid pulp.

17. The paper according to claim 16, wherein the aramid fibrid is 20-40 wt. % of para-aramid fibrid, in combination with 60-80 wt. % of meta-aramid shortcut.

18. Honeycomb core comprising a plurality of interconnected walls having surfaces that define a plurality of honeycomb cells, wherein the cell walls are formed from the paper according to claim 1.

19. A process for application of the paper according to claim 1, wherein the process comprises providing the paper into a product in a form as electrical insulation, a separator for batteries or supercapacitors, sandwich cores including honeycombs, folded cores, and corrugated cores, a filter, or printed wiring boards and backings for solar cells.

20. A process for improving z-strength of an aramid-based paper, the process comprising including 0.1-4.5 wt. % of polyamido-amine epichlorohydrin (PAE), calculated based on dry weight of the paper, with at least 90 wt. % of aramid material, calculated on dry paper components not including the PAE, the aramid material comprising at least one of aramid shortcut, aramid fibrid and aramid fibril, and the paper comprising at most 40 wt. % aramid pulp, calculated on the total amount of aramid material.

* * * * *